United States Patent
Shim et al.

(10) Patent No.: US 6,861,288 B2
(45) Date of Patent: Mar. 1, 2005

(54) STACKED SEMICONDUCTOR PACKAGES AND METHOD FOR THE FABRICATION THEREOF

(75) Inventors: Il Kwon Shim, Singapore (SG); Kambhampati Ramakrishna, Chandler, AZ (US); Seng Guan Chow, Singapore (SG); Byung Joon Han, Singapore (SG)

(73) Assignee: ST Assembly Test Services, Ltd., Singapore (SG)

( * ) Notice: Subject to any disclaimer, the term of this patent is extended or adjusted under 35 U.S.C. 154(b) by 0 days.

(21) Appl. No.: 10/676,736

(22) Filed: Sep. 30, 2003

(65) Prior Publication Data

US 2004/0145039 A1 Jul. 29, 2004

Related U.S. Application Data

(60) Provisional application No. 60/442,569, filed on Jan. 23, 2003.

(51) Int. Cl.[7] .................. H01L 21/44; H01L 21/48; H01L 21/50
(52) U.S. Cl. .............. 438/109; 438/107; 438/108; 438/122; 438/125; 438/617; 257/686; 257/723; 257/784
(58) Field of Search ................. 438/109, 107, 438/108, 122, 125, 617; 257/686, 723

(56) References Cited

U.S. PATENT DOCUMENTS

| | | | |
|---|---|---|---|
| 5,291,061 A | 3/1994 | Ball | |
| 6,278,613 B1 | 8/2001 | Fernandez et al. | |
| 6,340,846 B1 * | 1/2002 | LoBianco et al. | .......... 257/783 |
| 6,441,483 B1 | 8/2002 | Akram | |
| 6,472,758 B1 | 10/2002 | Glenn et al. | |
| 6,492,726 B1 | 12/2002 | Quek et al. | |
| 6,563,205 B1 | 5/2003 | Fogal et al. | |
| 6,577,013 B1 | 6/2003 | Glenn et al. | |
| 6,603,072 B1 | 8/2003 | Foster et al. | |
| 6,730,543 B2 * | 5/2004 | Akram | .......... 438/109 |

OTHER PUBLICATIONS

Eurasem B.V., "moulded cavity package", Data Sheet, 2 pages, Nijmegen, The Netherlands.

* cited by examiner

*Primary Examiner*—Nitin Parekh
(74) *Attorney, Agent, or Firm*—Mikio Ishimaru (57) ABSTRACT

A method for fabricating a stacked semiconductor package includes providing a substrate and mounting a first semiconductor device on the substrate. An interposer is supported above the first semiconductor device opposite the substrate. The interposer is electrically connected to the substrate. A second semiconductor device is then mounted on the interposer.

8 Claims, 9 Drawing Sheets

STACKED SEMICONDUCTOR PACKAGES AND METHOD FOR THE FABRICATION THEREOF

CROSS-REFERENCE TO RELATED APPLICATION(S)

This application claims the benefit of U.S. Provisional Patent Application No. 60/442,569 filed on Jan. 23, 2003, which is incorporated herein by reference thereto.

TECHNICAL FIELD

The present invention relates generally to semiconductor packages, and more particularly to stacked semiconductor assembly packages and methods for the fabrication thereof.

BACKGROUND ART

Ongoing goals of the computer industry include higher performance, lower cost, increased miniaturization of components, and greater packaging density of integrated circuits ("IC's"). As new generations of IC products are released, their functionality increases while the number of components needed to fabricate them decreases.

Semiconductor devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module substrate that is surrounded by a number of lead fingers. Each die has bonding pads that are then individually connected in a wire-bonding operation to the leadframe's lead finger pads using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual die on a substrate.

To further condense the packaging of individual devices, packages have been developed in which more than one device can be packaged at one time at each package site on a leadframe strip. Each package site on a leadframe strip is a structure that provides mechanical support for the individual IC devices. It also provides one or more layers of interconnect lines that enable the devices to be connected electrically to surrounding circuitry. Of importance to complicated packaging designs are considerations of input/output count, heat dissipation, matching of thermal expansion between a motherboard and its attached components, cost of manufacturing, ease of integration into an automated manufacturing facility, package reliability, and easy adaptability of the package to additional packaging interfaces such as a printed circuit board ("PCB").

Various chip-on-board ("COB") techniques are used to attach different semiconductor die to a PCB. COB techniques include flip chip attachment, wire bonding, and tape automated bonding ("TAB").

Flip chip attachment consists of attaching a flip chip to a PCB or to another substrate. A flip chip is a semiconductor chip that has a pattern or array of terminals spaced around on an attachment surface on the chip for face-down mounting to a substrate. Generally, the attachment surface of the flip chip has one of the following electrical connectors: ball grid array ("BGA") or slightly larger than IC carrier ("SLICC"). BGA is an electrical connector configuration having an array of minute solder balls disposed on the attachment surface of the flip chip for attaching to the substrate. SLICC is similar to the BGA, but has a smaller solder ball pitch and diameter than the BGA.

With the BGA or SLICC, the solder or other conductive ball arrangement on the flip chip must be a mirror image of the connecting bond pads on the PCB so that precise connection can be made. The flip chip is bonded to the PCB by melting (refluxing) the solder balls. The solder balls may also be replaced with a conductive polymer or gold stud bumps bonded using a conductive polymer.

Wire bonding attachment and TAB attachment generally begin with attaching a semiconductor chip to the surface of a small PCB with an appropriate adhesive such as an epoxy. With wire bonding attachment, wires are then attached, one at a time, to each bond pad on the semiconductor chip and extend to a corresponding metal lead or trace end on the PCB. With TAB, the ends of metal leads that are carried on an insulating tape are respectively attached to the bond pads on the semiconductor chip and to the lead or trace ends on the PCB. An encapsulant is then generally used to cover the bond wires and metal tape leads to prevent damage or contamination.

In some cases, multi-chip devices can be fabricated faster and more cheaply than a corresponding single IC chip that incorporates all the same functions. Current multi-chip modules typically consist of a PCB substrate onto which a set of separate IC chip components is directly attached. Such multi-chip modules have been found to increase circuit density and miniaturization, improve signal propagation speed, reduce overall device size and weight, improve performance, and lower costs—all primary goals of the computer industry.

However, such multi-chip modules can be bulky. IC package density is determined by the area required to mount a die or module on a circuit board. One method for reducing the board size of multi-chip modules and thereby increase their effective density is to stack the die or chips vertically within the module or package.

In one design, a pair of IC die is mounted on opposite sides of a leadframe paddle. Gold or aluminum wires then connect the wire bonding pads on both the upper die and the lower die with the ends of their associated leadframe lead extensions.

Other representative designs for mounting multiple semiconductor IC chips in a single, multi-chip package include: two chips mounted on two leadframe paddles, one chip mounted over a paddle and one below mounted on a board, and one chip attached on top of a larger chip that is attached below to a paddle. These and other configurations have also been extended to include three or more chips mounted together vertically in a single package.

Such designs are improvements over prior multi-chip package and system-in-a-package ("SiP") designs that combined several semiconductor die and associated passive components ("passives") side by side in a single, horizontal layer. Combining them into a single horizontal layer used board space inefficiently by consuming large substrate areas, and afforded less advantage in circuit miniaturization.

However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that are free of defects are then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Two of the common die stacking methods are: (a) larger lower die combined with a smaller upper die, and (b) so-called same-size die stacking. With the former, the die can be very close vertically since the electrical bond pads on the perimeter of the lower die extend beyond the edges of the smaller die on top. With same-size die stacking, the upper and lower die are spaced more vertically apart to provide sufficient clearance for the wire bonds to the lower die. As discussed, both these methods have inherent KGD and assembly process yield loss disadvantages since KGD cannot be used for fabricating these configurations.

Another previous design is package level stacking. This concept includes stacking of two or more packages. KGD and assembly process yields are not an issue since each package can be tested prior to assembly, allowing KGD to be used in assembling the stack. But package level stacking can pose other problems. One problem is package-to-package assembly process difficulties caused by irregularities in the flatness/coplanarity of the lower package. Another problem results from the increased stiffness of the overall assembly, which can lead to reduced board level reliability. Still another problem can arise from poor heat dissipation from the upper package.

Thus, despite the advantages of recent developments in semiconductor fabrication and packaging techniques, there is a continuing need for improved packaging methods, systems, and designs for increasing semiconductor die density in PCB assemblies.

Solutions to these problems have been long sought but prior developments have not taught or suggested any solutions and, thus, solutions to these problems have long eluded those skilled in the art.

DISCLOSURE OF THE INVENTION

The present invention provides a method for fabricating a stacked semiconductor package in which a substrate is provided and a first semiconductor device is mounted on the substrate. An interposer is supported above the first semiconductor device opposite the substrate. The interposer is electrically connected to the substrate. A second semiconductor device is then mounted on the interposer. This method of fabrication provides for improved packaging methods, systems, and designs for increasing semiconductor die density in printed circuit board assemblies.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the invention are semi-diagrammatic and not to scale and, particularly, some of the dimensions are for the clarity of presentation and are shown greatly exaggerated in the FIGS. In addition, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the die or the circuit board, regardless of its orientation. The term "vertical" refers to a direction perpendicular to the horizontal as just defined. Terms, such as "on", "above", "below", "bottom", "top", "side" (as in "sidewall"), "higher", "lower", and "under", are defined with respect to the horizontal plane.

Figure 1:
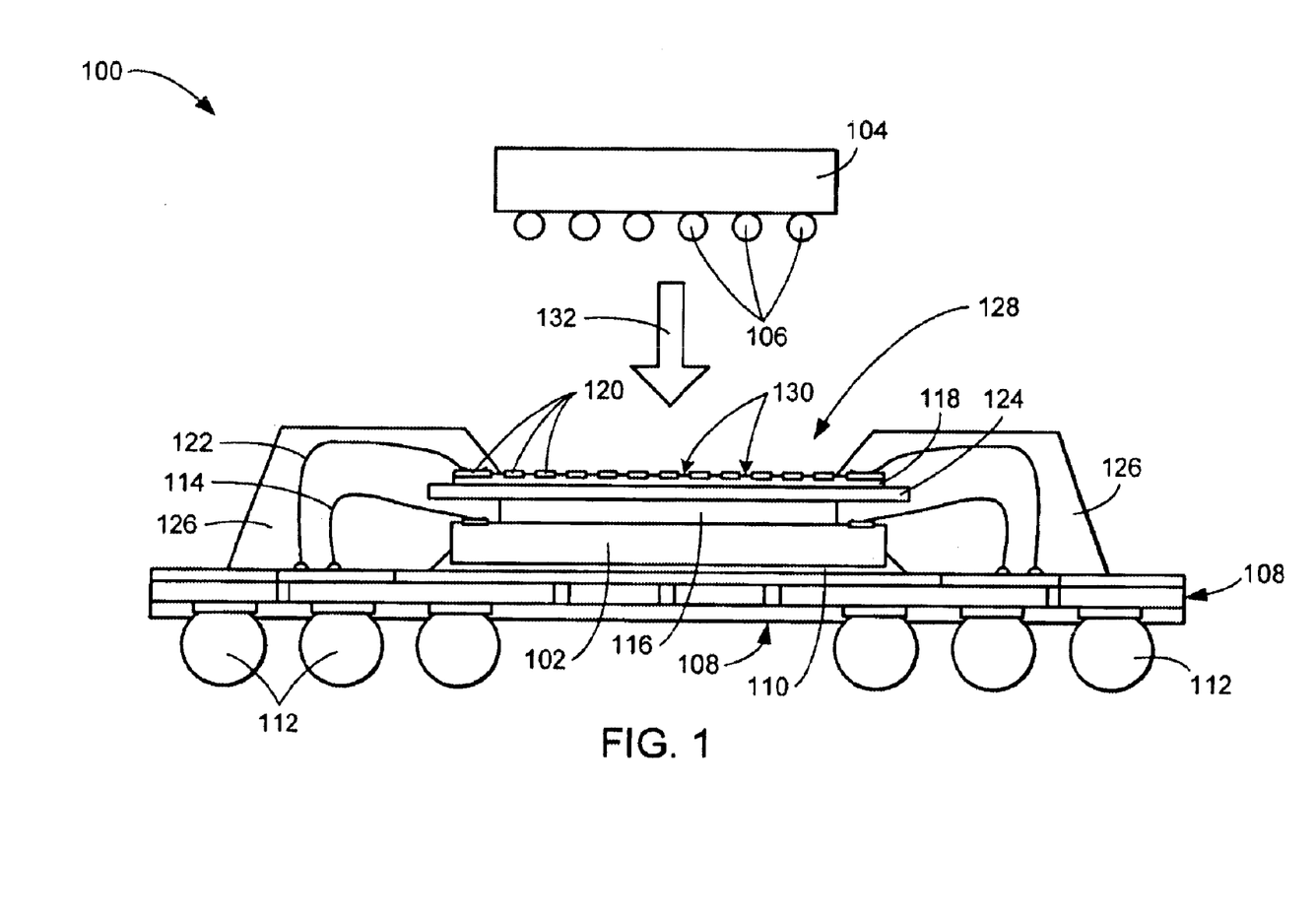
FIG. 1 is a view of a stacked semiconductor package in an intermediate stage of fabrication in accordance with the present invention.

Referring now to FIG. 1, therein is shown a stacked semiconductor package 100 in accordance with the present invention. As will be described further hereinbelow, the present invention provides for stacked semiconductor packages comprised of active semiconductor components, passive components, surface mountable passives, combination die, assembled semiconductor packages, and so forth, in numerous configurations and arrangements as may be needed.

The stacked semiconductor package 100, shown in an intermediate stage of fabrication, illustrates a package-to-package or homogeneous package solution. A first package 102 and a second package 104 are assembled and positioned vertically (one above the other) in the stacked semiconductor package 100. For illustrative purposes, the first package 102 and the second package 104 are functionally similar electronic semiconductor package systems, although it will be understood that they may be dissimilar as well. For example, the first package 102 is illustrated as a wire-bonded package and the second package 104 is illustrated as an area array package having a ball grid array ("BGA") interface 106.

The first package 102 has been mechanically and thermally attached to a first substrate 108 by an adhesive 110. The adhesive 110 is preferably a thermally conductive adhesive that is conventionally used for this purpose. On the bottom side of the first substrate 108 opposite the first package 102 is a BGA interface 112 for connecting the stacked semiconductor package 100 to an external substrate such as a printed circuit board ("PCB"). Electrical connections between the first package 102 and the first substrate 108 are provided in conventional fashion by wires 114 that are bonded to the first substrate 108 and the first package 102. The first substrate 108 then furnishes conventional internal electrical connections between the wires 114 and the various elements of the BGA interface 112.

On the side or face of the first package 102 opposite the first substrate 108 is a spacer 116. The spacer 116, preferably thermally conductive, may be a conventional thermal glue or film adhesive. The spacer 116 supports an interposer 118 that is attached thereto and spaced sufficiently from the first package 102 to provide clearance for the wires 114. The interposer 118 has bond fingers 120 around the periphery thereof (see FIG. 4). The bond fingers 120 are electrically connected by wires 122 to the first substrate 108 and the BGA interface 112, similarly as the first package 102 is connected to the first substrate 108 by the wires 114.

The interposer 118 may be additionally supported and reinforced by a stiffener 124. The stiffener 124, preferably made of thermally conductive metal, improves the physical integrity of the interposer 118 without significantly increasing the stiffness of the stacked semiconductor package 100. This improves the reliability of the interposer while not adversely impacting board-level reliability performance.

The first package 102, the spacer 116, the stiffener 124, the wires 114, and the wires 122 are then encapsulated for physical and environmental integrity in an encapsulant 126, such as liquid encapsulant or overmold. The bottom side of the interposer 118 facing the first package 102 is also encapsulated by the encapsulant 126. The sides and top perimeter of the interposer 118, containing the bond fingers 120, are also encapsulated as illustrated, but the top central portion of the interposer 118 is not encapsulated. Instead, the encapsulant 126 forms a partially molded bottom package having an open cavity 128 on top in which the central part 130 of the top of the interposer 118 is exposed.

Final assembly of the stacked semiconductor package 100 is then accomplished by positioning the second package 104 into the open cavity 128, as illustrated by the arrow 132, and completing electrical connections to the second package 104. Electrical connection of the second package 104 in this embodiment is to the interposer 118 by means of the BGA interface 106 and a corresponding terminal pad array (not shown in FIG. 1, but see the terminal pad array 400 in FIG. 4). If desired, the second package 104 may then be encapsulated within the open cavity 128.

Advantageously, the first package 102 and the second package 104 may each be individually tested in advance of assembly together into the stacked semiconductor package 100 to assure that the packages are each properly formed and contain good die. The packages thus are know-good-die ("KGD"), thereby substantially improving the assembly process yield performance during fabrication of the stacked semiconductor packages 100.

Figure 2:
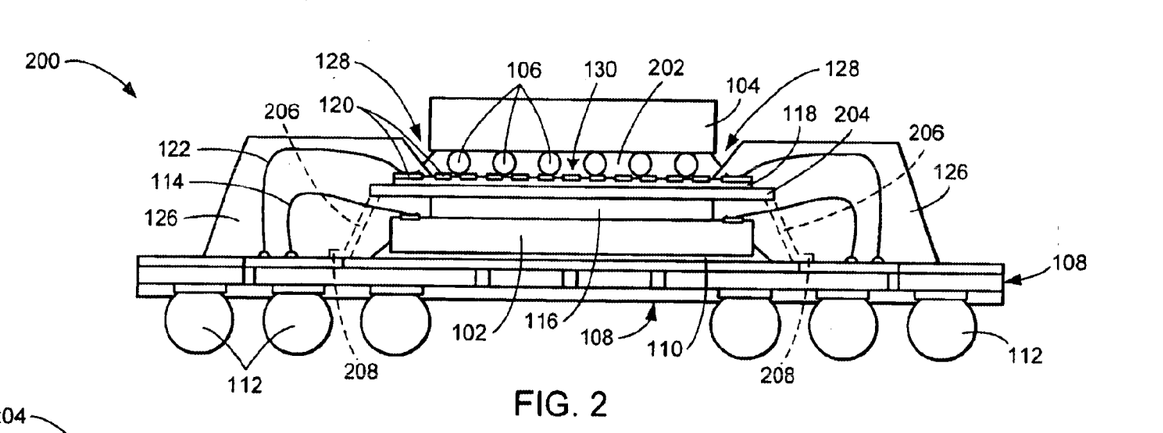
FIG. 2 is a view of a stacked semiconductor package embodiment similar to the structure of FIG. 1, with a stiffener having supporting legs.

Referring now to FIG. 2, therein is shown a stacked semiconductor package 200 that is similar to the stacked semiconductor package 100 (FIG. 1). The stacked semiconductor package 200 has been assembled by positioning and attaching the second package 104 to the interposer 118 within the open cavity 128. A thermally conductive underfill 202, which is optional, has also been provided and is located beneath the second package 104, between it and the interposer 118.

As shown in FIG. 2, a stiffener 204 has been incorporated into the stacked semiconductor package 200. The stiffener 204 is similar to the stiffener 124 (FIG. 1), but in addition, includes supporting legs 206 extending down and being supported on the first substrate 108. Pads 208, on the ends of the supporting legs 206 opposite the interposer 118, enhance the support of the stiffener 204 on the first substrate 108, providing thermal contact therewith, and enabling electrical contact when desired.

Figure 3:
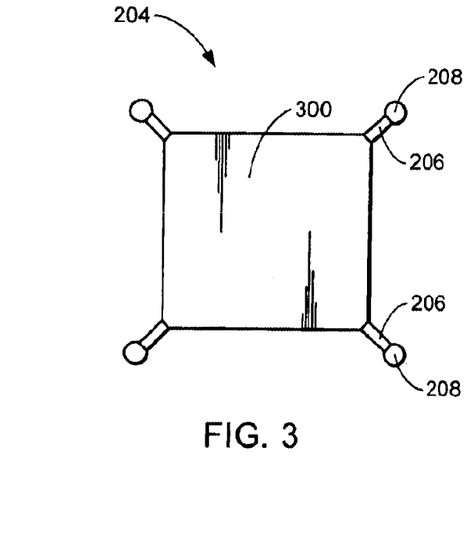
FIG. 3 is a top view of the stiffener shown in FIG. 2.

Referring now to FIG. 3, therein is shown a top view of the stiffener 204 (FIG. 2). As can be seen, the central portion of the stiffener 204 is a metal plane 300 supported by the supporting legs 206.

Figure 4:
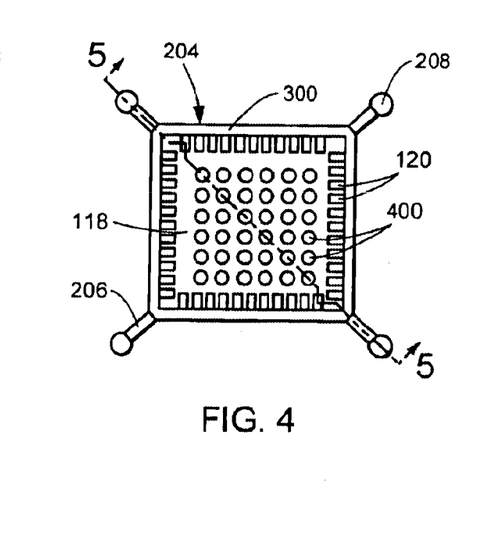
FIG. 4 is a top view of the stiffener and interposer shown in FIG. 2.

Referring now to FIG. 4, therein is shown the stiffener 204 with the interposer 118 attached thereon (as shown in FIG. 2). As can be seen, the top periphery of the interposer 118 is provided with the bond fingers 120, and the top center is provided with a terminal pad array 400. The terminal pad array 400 connects in conventional fashion to the second package 104 through the BGA interface 106 thereon (as shown generally in FIG. 2).

Figure 5:
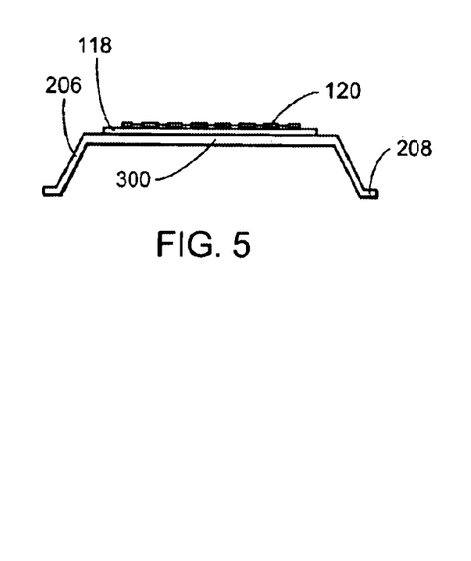
FIG. 5 is a cross-sectional view of the structure of FIG. 4 taken on line 5—5 thereof.

Referring now to FIG. 5, therein is shown a cross-sectional view of the structure of FIG. 4 taken on line 5—5 thereof. As can be seen from this view and from FIG. 4, the configuration of the stiffener 204 is a pedestal with four legs. It will be understood, of course, that the pedestal stiffener may have more or fewer legs as needed or appropriate for a particular application. Also, although the stiffener 204 is preferably made of copper or another suitable alloy, it may also be formed of other appropriate materials according to the particular needs at hand.

The interposer 118 is a substrate made preferably of either an organic laminate, a flexible circuit tape, or a ceramic material conventionally used for such substrates. Other appropriate materials may also be used, of course, according to the needs at hand.

It will also be understood that other interface configurations and interconnect methods may be used besides wire bonded and BGA interfaces. Examples include leaded interfaces and adhesive and solder attaching. This applies both to the stacked packages such as the first package 102 and the second package 104, and to the interface for connecting the first substrate 108 to a main circuit board.

Figure 6:
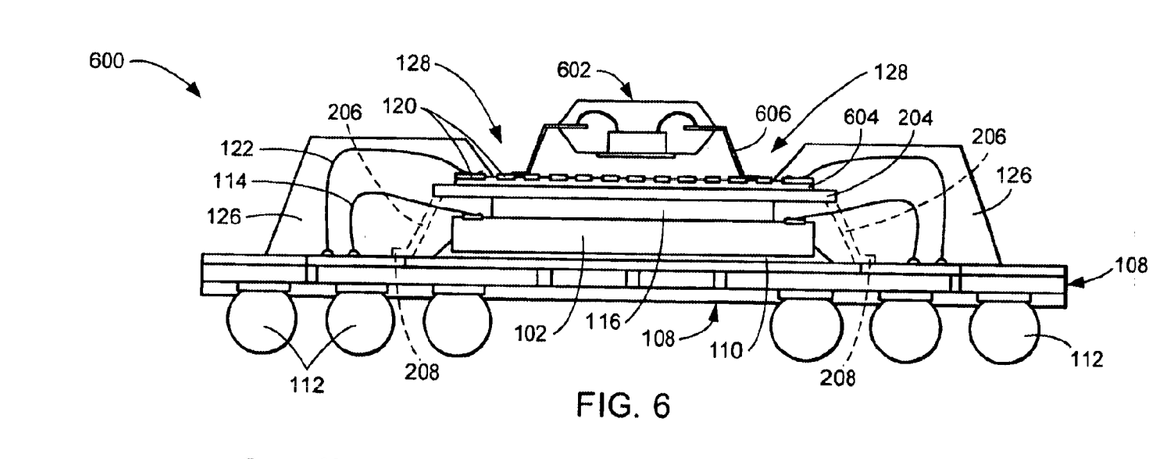
FIG. 6 is a view of a stacked semiconductor package embodiment illustrating a heterogeneous package-stacking configuration.

Referring now to FIG. 6, therein is shown a stacked semiconductor package 600 that is similar to the stacked semiconductor package 200 (FIG. 2) except that the stacked semiconductor package 600 illustrates a heterogeneous package-stacking configuration. That is, instead of a flip chip package mounted on the interposer, such as the second package 104 and the interposer 118 in FIG. 2, a leaded package 602 is shown attached to and supported on an interposer 604. The interposer 604 is similar to the interposer 118 (FIG. 4) except that the interposer 604 has terminal pads 700 (see FIG. 7) for receiving and connecting to the leads 606 of the leaded package 602.

Figure 7:
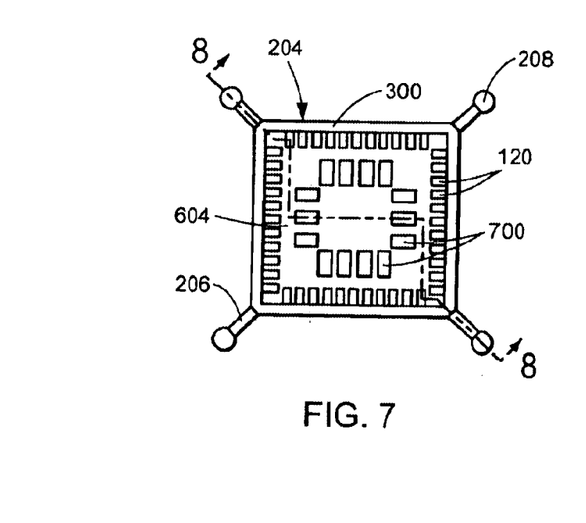
FIG. 7 is a top view of the interposer and stiffener shown in FIG. 6.

Referring now to FIG. 7, therein is shown a top view, similar to FIG. 4, of the interposer 604 (FIG. 6) mounted and supported on the stiffener 204. The terminal pads 700 for the leads 606 of the leaded package 602 are arranged in the central portion of the interposer 604. Except for the provision of the terminal pads 700 rather than the terminal pad array 400 (FIG. 4), the interposer 604 is otherwise similar to the interposer 118 (FIG. 4). Both have the bond fingers 120 on the periphery for connection to the wires 122.

Figure 8:
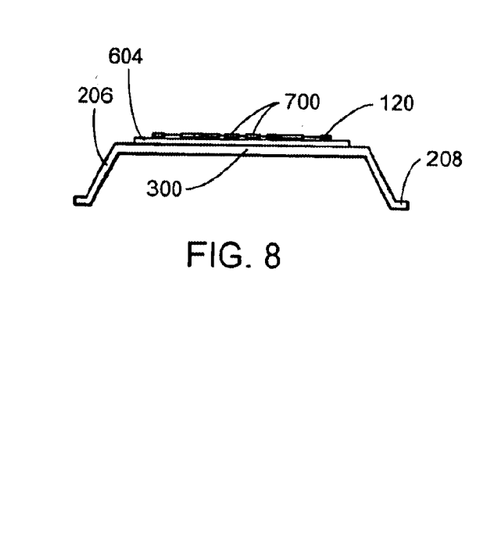
FIG. 8 is a cross-sectional view of the structure of FIG. 7 taken on line 8—8 thereof.

Referring now to FIG. 8, therein is shown a cross-sectional view of the structure of FIG. 7 taken on line 8—8 thereof.

Figure 9:
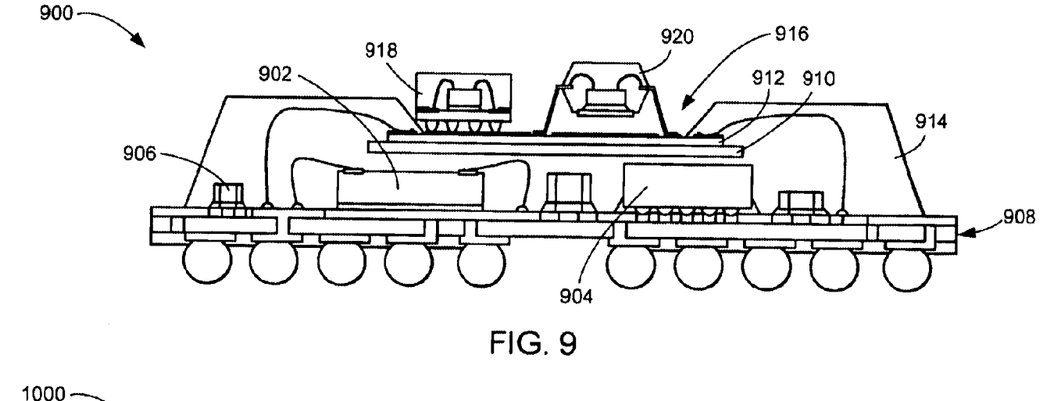
FIG. 9 is a view of a stacked multiple system-in-package semiconductor package embodiment having two sub-systems.

Referring now to FIG. 9, therein is shown a stacked semiconductor package 900 illustrating a stacked multiple system-in-package ("SiP") semiconductor package having two subsystems. The stacked semiconductor package 900 includes a wire-bonded die 902 comprising a first subsystem, a flip chip die with BGA interface 904 comprising a second subsystem, and various passive circuit components 906, all mounted on a BGA substrate 908. Together, these constitute a first or lower SiP layer. A stiffener 910 is mounted and supported thereabove, similarly as the stiffener 124 (FIG. 1) and the stiffener 204 (FIG. 2). In like fashion, an interposer 912 is mounted and supported on the stiffener 910. These in turn are mechanically and environmentally protected by encapsulation within an encapsulant 914 that is applied by partial molding to leave the central portion of the interposer 912 exposed in an open cavity 916.

The second or upper layer of the stacked semiconductor package 900, mounted on the interposer 912, includes a pre-packaged BGA subsystem 918 and a pre-packaged leaded subsystem 920. It will be understood that these components are selected herein to show the versatility of the present invention, and that the interposer 912 and pre-packaged subsystems may be selected from any appropriate pre-packaged area array, leaded products, direct chip attach devices, and so forth, with or without passive integration, as may be needed or appropriate for the application at hand. The same, of course, will be understood to apply to the lower (SiP) portions of the stacked semiconductor package 900.

Figure 10:
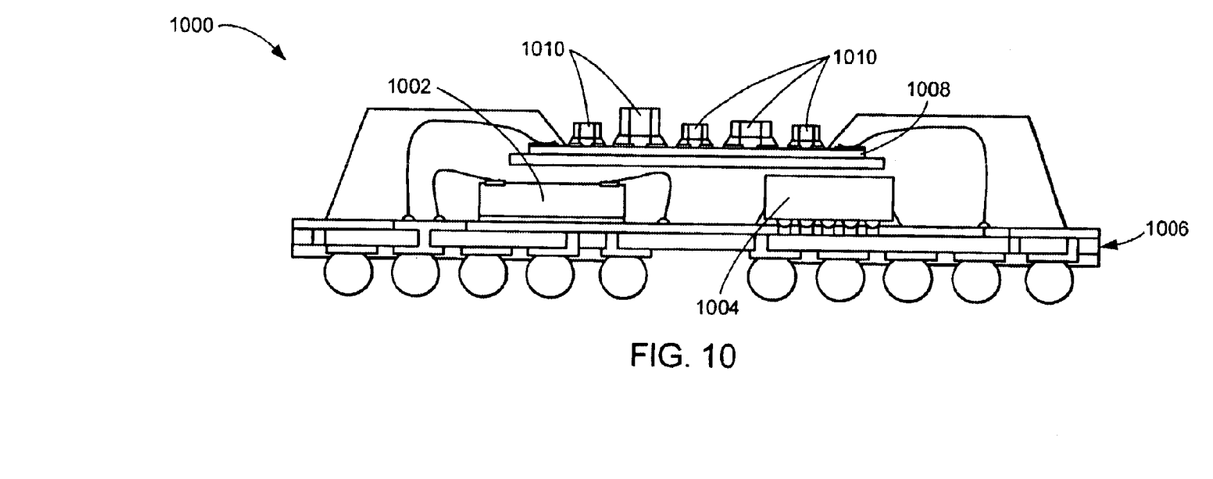
FIG. 10 is a view of a stacked system-in-package semiconductor package embodiment having passive components attached on a stacked interposer board.

Referring now to FIG. 10, therein is shown a stacked semiconductor package 1000 illustrating a stacked system-in-package semiconductor package having passive components attached on a stacked interposer board. The stacked semiconductor package 1000 includes a wire-bonded die 1002 and a flip chip die with BGA interface 1004 mounted on a BGA substrate 1006, similarly as in the stacked semiconductor package 900 (FIG. 9). However, the stacked semiconductor package 1000 includes an interposer 1008 that constitutes a passive component board to which a variety of passive components 1010 is attached.

Figure 11:
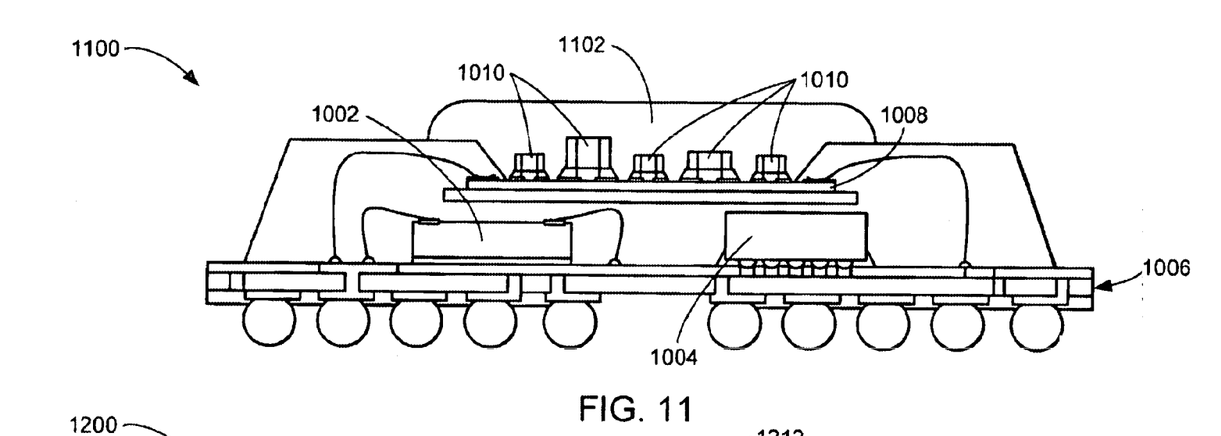
FIG. 11 is a view of the structure of FIG. 10 after encapsulation of the interposer and components thereon, and illustrating a fully assembled and completed stacked semiconductor package.

Referring now to FIG. 11, therein is shown a stacked semiconductor package 1100 which is the stacked semiconductor package 1000 (FIG. 10) following encapsulation of the interposer 1008 and the components thereon by a top encapsulant 1102. The stacked semiconductor package 1100 thus illustrates a fully assembled and completed stacked semiconductor package.

Figure 12:
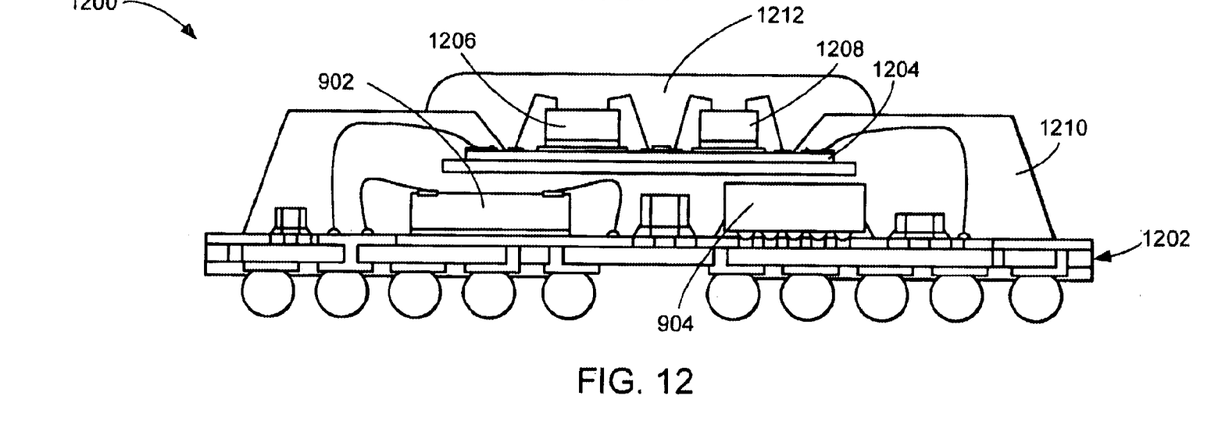
FIG. 12 is a view of a stacked semiconductor package embodiment with multiple systems in a package.

Referring now to FIG. 12, therein is shown a stacked semiconductor package 1200 illustrating an embodiment having multiple systems in a package. For example, the stacked semiconductor package 1200 has a substrate 1202 similar to the BGA substrate 908 (FIG. 9). Similar components to those in FIG. 9 are mounted thereon to provide an SiP on the lower package level, similarly again as described more fully with respect to the stacked semiconductor package 900 (FIG. 9).

An interposer 1204 is mounted in the stacked semiconductor package 1200, defining an upper level that receives two subsystems 1206 and 1208 thereon. While the subsystems 1206 and 1208 are illustrated as wire-bonded subsystems, it will be understood that the interposer 1204 may be appropriately configured to receive any chip-on-board ("COB"), flip chip, direct chip attach ("DCA"), and/or passive integration subsystems as may be necessary or desired for the application at hand.

The stacked semiconductor package 1200 is shown in its fully assembled or completed configuration, with a partially molded encapsulant 1210 filled and sealed at its center by a top encapsulant 1212, over the subsystems 1206 and 1208.

Figures 13, 14, 15, 16:
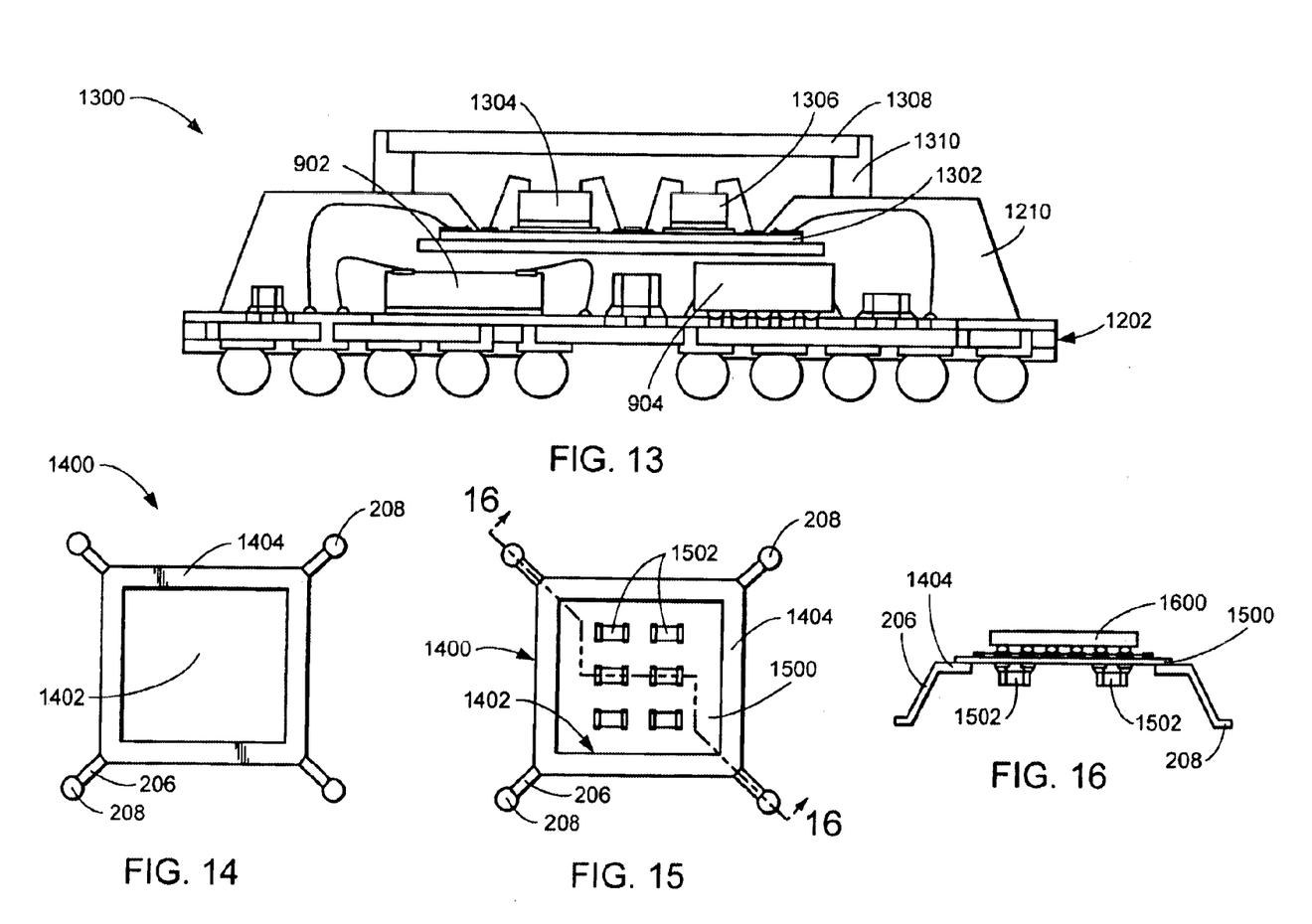
FIG. 13 is a view of a stacked semiconductor package embodiment having several optical sensor devices supported on an interposer on the upper level of the package.
FIG. 14 is a view of a stiffener embodiment modified to incorporate a large central opening in the metal plane of the stiffener.
FIG. 15 is a bottom view of the structure of FIG. 14 with an interposer mounted on the top thereof.
FIG. 16 is an inverted cross-sectional view of the structure of FIG. 15 taken on line 16—16 thereof.

Referring now to FIG. 13, therein is shown a stacked semiconductor package 1300 in which an interposer 1302 supports several optical sensor devices 1304 and 1306 on the upper level of the stacked semiconductor package 1300. The optical sensor devices 1304 and 1306 may be protectively mounted behind a glass window 1308 supported by a sealing dam 1310.

Referring now to FIG. 14, therein is shown a stiffener 1400 that has been modified to incorporate a large central opening 1402 in the metal plane 1404 thereof. The large central opening 1402 allows an interposer to be supported thereover with components mounted on both sides thereof.

Referring now to FIG. 15, therein is shown a bottom view of the structure of FIG. 14 having an interposer 1500 mounted on the top thereof. Circuit components 1502 are joined to the bottom of the interposer 1500 within the large central opening 1402.

Referring now to FIG. 16, therein is shown an inverted cross-sectional view of the structure of FIG. 15 taken on line 16—16 thereof. As can be seen, the large central opening 1402 allows circuit components, such as the circuit components 1502 and an opposing circuit component 1600, to be mounted on both sides (bottom and top, respectively) of the interposer 1500.

Figure 17:
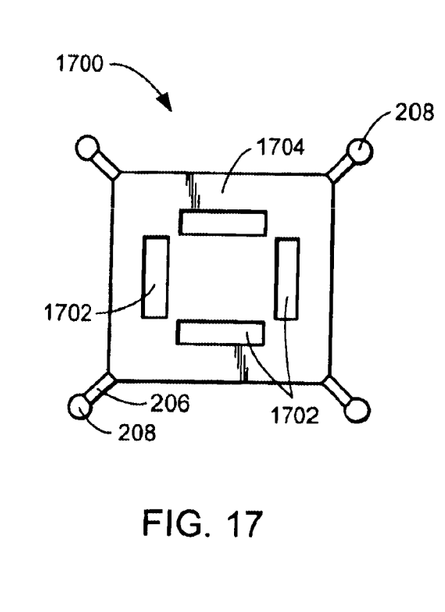
FIG. 17 is a view of a stiffener embodiment with multiple slots arranged thereon between the center and periphery of the metal plane.

Referring now to FIG. 17, therein is shown a stiffener 1700 having multiple slots 1702 arranged thereon between the center and the periphery of the metal plane 1704 thereof. The multiple slots 1702 can provide a bottom-mounted die with access therethrough to an interposer mounted on top of the stiffener 1700.

Figure 18:
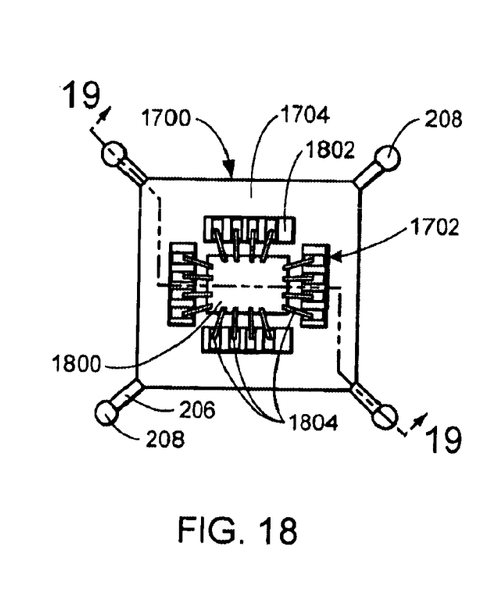
FIG. 18 is a bottom view of the structure of FIG. 17 with a wire-bonded die attached to the bottom of the metal plane.

Referring now to FIG. 18, therein is shown a bottom view of the stiffener 1700 (FIG. 17). A wire-bonded die 1800 is attached to the bottom of the metal plane 1704 of the stiffener 1700. The multiple slots 1702 allow the wire-bonded die 1800 to connect electrically to an interposer 1802 mounted on the opposite, or top, side of the metal plane 1704 of the stiffener 1700. As can be seen, bonding wires 1804 connect through the multiple slots 1702 between the wire-bonded die 1800 and the interposer 1802.

Figure 19:
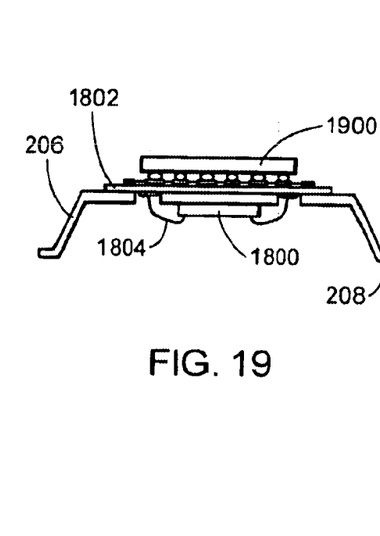
FIG. 19 is an inverted cross-sectional view of the structure of FIG. 18 taken on line 19—19 thereof.

Referring now to FIG. 19, therein is shown an inverted cross-sectional view of the structure of FIG. 18 taken on line 19—19 thereof. An active circuit component 1900 can be seen mounted on the top of the interposer 1802, opposite the wire-bonded die 1800.

Figure 20:
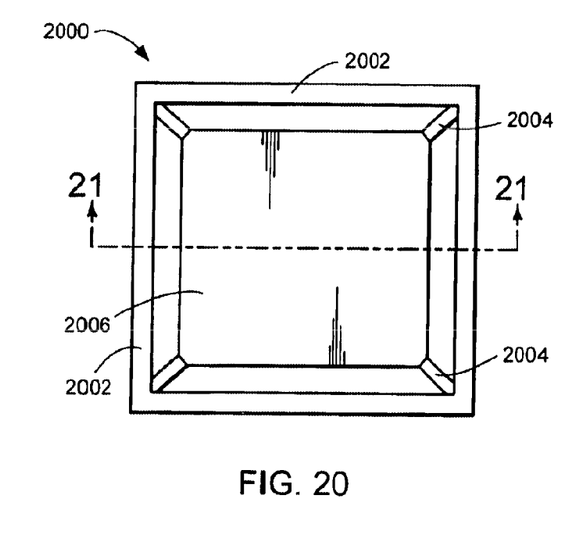
FIG. 20 is a bottom view of a stiffener embodiment with a window frame-type base supporting member opposite the metal plane.

Referring now to FIG. 20, therein is shown a bottom view of a stiffener 2000 having a window frame-type base supporting member 2002 extending between and connecting the legs 2004 of the stiffener 2000, opposite the metal plane 2006 thereof. The window frame type base supporting member 2002 enhances the stiffness of the stiffener 2000. Because the stiffener 2000 is preferably made of metal, the window frame-type base supporting member 2002 also enhances the thermal and electrical performance not only of the stiffener 2000, but also of the entire package into which it is incorporated.

Figure 21:
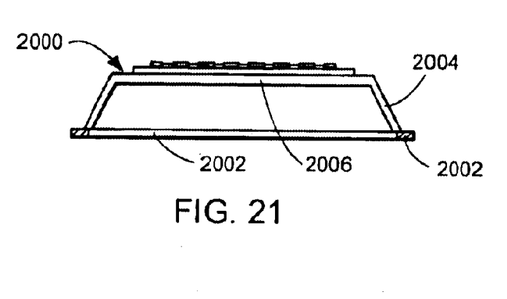
FIG. 21 is an inverted cross-sectional view of the structure of FIG. 20 taken on line 21—21 thereof.

Referring now to FIG. 21, therein is shown an inverted cross-sectional view of the structure of FIG. 20 taken on line 21—21 thereof.

Figure 22:
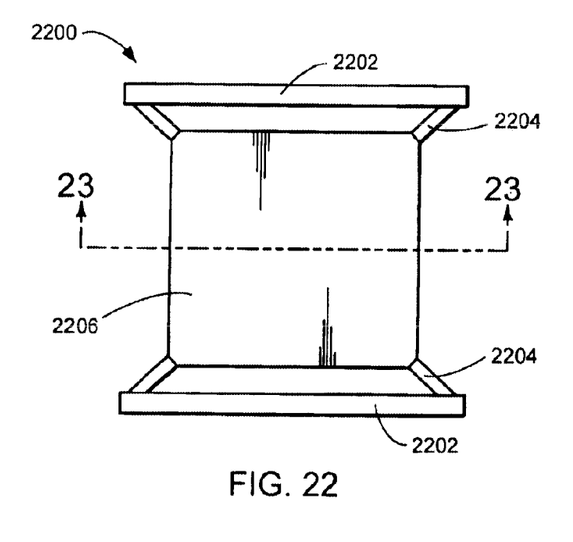
FIG. 22 is a bottom view of a stiffener embodiment having a double-sides base-type supporting member opposite the metal plane.

Referring now to FIG. 22, therein is shown a bottom view of a stiffener 2200 having a double-sides type base supporting member 2202 that connects the legs 2204 thereof in pairs, opposite the metal plane 2206 thereof. The double-sides type base supporting member 2202 also serves to enhance the stiffness of the stiffener 2200. Being preferably made of metal, it serves as well to enhance the thermal and electrical performance of the package into which it is to be incorporated.

Figure 23:
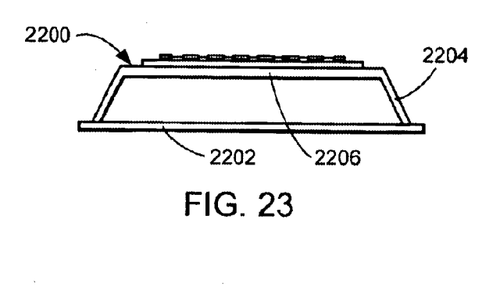
FIG. 23 is an inverted cross-sectional view of the structure of FIG. 22 taken on line 23—23 thereof.

Referring now to FIG. 23, therein is shown an inverted cross-sectional view of the structure of FIG. 22 taken on line 23—23 thereof.

Figure 24:
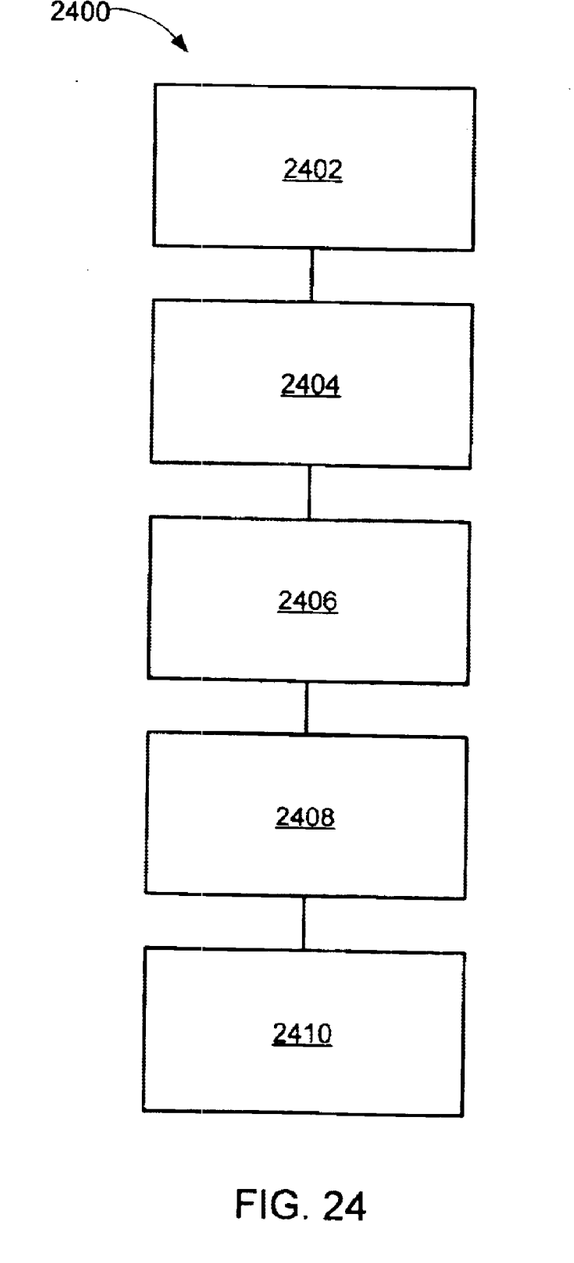
FIG. 24 is a flow chart of a method for fabricating a stacked semiconductor package in accordance with the present invention.

Referring now to FIG. 24, therein is shown a flow chart of a method 2400 for fabricating a stacked semiconductor package in accordance with the present invention. The method 2400 includes providing a substrate in a block 2402; mounting a first semiconductor device on the substrate in a block 2404; supporting an interposer above the first semiconductor device opposite the substrate in a block 2406; electrically connecting the interposer to the substrate in a block 2408; and mounting a second semiconductor device on the interposer in a block 2410.

It has been discovered that the present invention has numerous advantages. One advantage is the improved thermal performance of the upper package die. The improved thermal performance is afforded by the metallic pedestal stiffener that enables heat flow from the upper packages through the interposer to the lower substrate and/or lower die.

Another advantage is improved board level reliability performance afforded by an interposer comprised of a substrate attached to a metallic pedestal stiffener. The stiffener forms a standoff that does not significantly increase the stiffness of the package, and hence does not affect or degrade board level reliability performance.

Yet another advantage of the present invention is routability. That is, the interposer can be configured as a separate, fully functional substrate having a full suite of circuit board electrical routing connections. This is a significant improvement over prior systems that position one die over another and then merely connect the upper die to a single lower circuit board using longer bonding wires.

The routability of the present invention affords still another important advantage—the ability to combine subsystems in a manner similar to package-level stacking but with the added benefit of high thermal performance and high board-level reliability.

Another advantage is the full testability provided by the present invention. That is, the several die, components, and/or packages can be fully tested prior to assembling them together into the stacked semiconductor package. This can virtually eliminate the risk of combining a good component with a bad component in the final assembled package.

Still another important advantage is that the stacked semiconductor package can be assembled from two or more subsystems that themselves are each assembled and tested independently prior to final assembly. In fact, in the case of integration of a large system, testing can be very complicated and expensive, and in some cases it may not be possible to test all the aspects of system functionality. However, a major advantage of the present invention is that separate subsystems can be fully tested prior to such an assembly.

Thus, it has been discovered that the stacked semiconductor package method and apparatus of the present invention furnish important and heretofore unavailable solutions, capabilities, and functional advantages. KGD and assembly process yield issues are effectively removed. Active chip and passive component configurations can be assembled in nearly limitless combinations as may be required. Different chip and package connection interfaces, whether flip chip, leaded, or other, are readily accommodated. The resulting process and configurations are straightforward, economical, uncomplicated, highly versatile and effective, and fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for fabricating a stacked semiconductor package, comprising steps of:

provide a substrate;

mounting a first semiconductor device on the substrate;

supporting an interposer above the first semiconductor device opposite the substrate;

electrically connecting the interposer to the substrate wherein the step of supporting the interposer further comprises supporting the interposer on a metallic stiffener having a plurality of legs contacting the substrate and supporting the metallic stiffener on the substrate; and mounting a second semiconductor device on the interposer.

2. The method of claim 1 further comprising partial mold encapsulating at least the first semiconductor device and at least a portion of the interposer to form an open cavity over the interposer.

3. The method of claim 1 further comprising forming at least one opening through the metallic stiffener for attaching at least one semiconductor device therethrough.

4. The method of claim 1 further comprising enhancing the stiffness of the metallic stiffener by connecting at least one pair of the legs with at least one base supporting member.

5. A method for fabricating a stacked semiconductor package, comprising steps of:

providing a substrate;

mounting a first semiconductor device on the substrate;

supporting an interposer on a metallic stiffener above the first semiconductor device opposite the substrate wherein the step of supporting the interposer further comprises supporting the interposer on a plane on the metallic stiffener, the metallic stiffener having a plurality of legs contacting the substrate and supporting the metallic stiffener on the substrate;

electrically connecting the interposer to the substrate;

partial mold encapsulating at least the first semiconductor device and at least a portion of the interposer to form an open cavity over the interposer;

mounting a second semiconductor device on the interposer within the cavity; and encapsulating the cavity with a top encapsulant.

6. The method of claim 5 further comprising forming at least one opening through the plane for attaching at least one semiconductor device therethrough.

7. The method of claim 5 further comprising enhancing the stiffness of the metallic stiffener by connecting at least one pair of the legs opposite the plane with at least one base supporting member.

8. The method of claim 5 further comprising selecting the first and second semiconductor devices from at least one of a die, a flip chip die, a surface mountable passive, a multi-chip package, a fully assembled semiconductor package, a leadframe-based fully assembled semiconductor package, an array-based fully assembled semiconductor package, a system-in-a-package, and a combination thereof.

* * * * *